(12) United States Patent
Kim

(10) Patent No.: US 7,879,640 B2
(45) Date of Patent: Feb. 1, 2011

(54) CMOS IMAGE SENSOR AND METHOD FOR FABRICATING THE SAME

(75) Inventor: Sang Sik Kim, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 282 days.

(21) Appl. No.: 11/932,483

(22) Filed: Oct. 31, 2007

(65) Prior Publication Data

US 2008/0157154 A1 Jul. 3, 2008

(30) Foreign Application Priority Data

Dec. 28, 2006 (KR) ............... 10-2006-0135935

(51) Int. Cl.
*H01L 21/00* (2006.01)
(52) U.S. Cl. ........... 438/70; 257/E21.617; 257/E27.133
(58) Field of Classification Search ................ 257/294, 257/432, 440, 443, 436, E27.133 M, E27.134, 257/E31.121, E31.127, 292, E27.13, E27.133, 257/E21.617; 438/65, 66, 69, 70, 73, 48
See application file for complete search history.

(56) References Cited

U.S. PATENT DOCUMENTS

| | | | | |
|---|---|---|---|---|
| 5,672,519 A | * | 9/1997 | Song et al. ............... | 438/69 |
| 6,566,269 B1 | * | 5/2003 | Biles et al. ............... | 438/706 |
| 6,665,014 B1 | * | 12/2003 | Assadi et al. ............. | 348/340 |
| 2006/0011932 A1 | * | 1/2006 | Kim ........................... | 257/98 |
| 2006/0138497 A1 | * | 6/2006 | Kim ........................... | 257/294 |
| 2006/0141654 A1 | * | 6/2006 | Lim ........................... | 438/48 |
| 2007/0161146 A1 | * | 7/2007 | Lee ........................... | 438/70 |

* cited by examiner

*Primary Examiner*—Matthew C Landau
*Assistant Examiner*—Latanya Crawford
(74) *Attorney, Agent, or Firm*—Workman Nydegger

(57) ABSTRACT

A Complementary Metal Oxide Semiconductor (CMOS) image sensor and methods for fabricating the same. In one example embodiment of the invention, a method for manufacturing a Complementary Metal Oxide Semiconductor (CMOS) image sensor includes several acts. First, a metal pad is formed over a semiconductor substrate. Next, a protection film is formed over the semiconductor substrate and the metal pad. Then, the protection film is selectively removed to expose a surface of the metal pad. Next, a first planarization film is formed over the protection film. Then, a color filter layer is formed over the first planarization film. Next, a second planarization layer is formed over the color filter layer. Then, a first material layer is formed over the second planarization layer. Next, a second material layer is formed over the first material layer. Then, a micro lens is formed out of the first and second material layers.

10 Claims, 5 Drawing Sheets

CMOS IMAGE SENSOR AND METHOD FOR FABRICATING THE SAME

CROSS-REFERENCE TO RELATED APPLICATION

This application claims priority to Korean Application No. 10-2006-0135935, filed on Dec. 28, 2006, which is incorporated herein by reference in its entirety.

BACKGROUND

1. Field of the Invention

The invention relates to methods for manufacturing a Complementary Metal Oxide Semiconductor (CMOS) image sensor.

2. Description of the Related Art

In general, an image sensor is a semiconductor device capable of converting an optical image into an electrical signal. Image sensors can generally be classified into Charge Coupled Device (CCD) image sensors and Complementary Metal Oxide Semiconductor (CMOS) image sensors.

In CCD image sensors, a plurality of Metal Oxide Silicon (MOS) capacitors are positioned adjacent to each other. Charge carriers can be stored in each capacitor and transferred to its adjacent neighbors.

CMOS image sensors employ a switching way for forming MOS transistors corresponding to a quantity of unit pixels in a semiconductor substrate. The unit pixels use a CMOS technology with a control circuit and a signal processing circuit as peripheral circuits. CMOS image sensors can therefore sequentially detect an output of each unit pixel by the MOS transistors. In greater detail, a CMOS image sensor includes a photodiode and a Metal Oxide Semiconductor (MOS) transistor within each unit pixel and thus, sequentially detecting an electrical signal of each unit pixel is possible.

CMOS image sensors use CMOS fabrication technology and thus, exhibit low power consumption and are relatively simple to fabricate due to fewer required photo processes. CMOS image sensor are also relatively simple to miniaturize because a control circuit, a signal processing circuit, and an analog-to-digital conversion circuit can be integrated into a CMOS image sensor chip. Accordingly, CMOS image sensors are widely used in diverse applications, such as digital still cameras and digital video cameras.

In the CMOS image sensor, color filters are arranged over a light sensing portion for receiving light from the exterior and generating and accumulating optical charges. Color Filter Arrays (CFAs) generally include three colors: red, green, and blue; or yellow, magenta, and cyan.

An image sensor includes a light sensing portion for sensing light and a logic circuit portion for converting the sensed light into an electrical data signal. In order to enhance photosensitivity, attempts have been made to increase a fill factor between an occupation area of the light sensing portion and a total area of the image sensor. However, there is a limit to effectiveness of these attempts because the logic circuit portion cannot be fundamentally uninstalled. Accordingly, in order to increase photosensitivity, a focusing technology has been developed that changes a path of light incident on regions other than the light sensing portion and focuses the incident light on the light sensing portion. This focusing is accomplished by forming a micro lens over a color filter.

However, where forming a micro lens over a color filter, a fill factor of an occupation area of a light sensing portion gets smaller as a pixel size gets smaller. Thus, due to a shortage of a quantity of incident light, photoelectric conversion charges consequently reduce in number and thus photosensitivity reduces. As a result, the image sensor is deteriorated in quality. Accordingly, in order to compensate for a poor sensitivity caused by a reduction of the fill factor of the occupation area of the light sensing portion, attempts have been made at overcoming the reduction of the pixel size by forming a focusing micro lens more efficiently and enhancing sensitivity.

FIGS. 1A to 1E are process cross-sectional diagrams of a prior art method for manufacturing a CMOS image sensor.

As disclosed in FIG. 1A, an insulating film 101 is formed on a semiconductor substrate 100. Next, a metal pad 102 for each signal line is formed over the insulating film 101. Then, a protection film 103 is formed on the interlayer insulating film 101 and the metal pad 102. The protection film 103 is formed of oxide or nitride.

As disclosed in FIG. 1B, a photosensitive film 104 is then coated on the protection film 103. Next, the photosensitive film 104 is selectively patterned to expose an upper portion of the metal pad 102 in an exposure and development process. A pad opening portion 105 is formed at the metal pad 102 by selectively etching the protection film 103 using the patterned photosensitive film 104 as a mask.

As disclosed in FIG. 1C, the photosensitive film 104 is then removed. Next, the semiconductor substrate 100 is processed by wet cleaning. Then, a first planarization layer 106 is deposited on the protection film 103. A blue color filter layer 107, a green color filter layer 108, and a red color filter layer 109 are subsequently formed on the first planarization layer 106.

As disclosed in FIG. 1D, a second planarization layer 111 is then formed over a portion of the first planarization layer 106 and the color filter layers 107, 108, and 109.

As disclosed in FIG. 1E, micro lenses 112 are then formed corresponding to the respective color filter layers 107, 108, and 109 on the second planarization layer 111. A probe test is next performed for each metal pad 102 of the above-constructed CMOS image sensor to check a contact resistance. Then, if the contact resistance is not in an abnormal condition, the metal pad electrically connects with an external driving circuit.

One disadvantage of the prior art method for manufacturing a CMOS image sensor disclosed in FIGS. 1A-1E is that the resolution of the micro lens 112 is reduced due to the second planarization layer 111 being formed using an i-line or g-line Middle UltraViolet (MUV) photoresist. A stripe patterned defect is caused by a CD difference because an MUV pattern with a bad uniformity reflows and increases in size resulting in increasing the size of the micro lens.

SUMMARY OF EXAMPLE EMBODIMENTS

In general, example embodiments of the invention relate to methods for manufacturing a CMOS image sensor, for uniformly providing a gap of 50 nm or less between micro lenses before a process for the focusing micro lens, thereby overcoming a resolution limit of the top micro lens and a linearity of a Critical Dimension (CD) and improving uniformity.

In one example embodiment of the invention, a method for manufacturing a Complementary Metal Oxide Semiconductor (CMOS) image sensor includes several acts. First, a metal pad is formed over a semiconductor substrate. Next, a protection film is formed over the semiconductor substrate and the metal pad. Then, the protection film is selectively removed to expose a surface of the metal pad. Next, a first planarization film is formed over the protection film. Then, a color filter layer is formed over the first planarization film. Next, a second planarization layer is formed over the color filter layer. Then, a first material layer is formed over the second planarization layer. Next, a second material layer is formed over the first material layer. Then, a micro lens is formed out of the first and second material layers.

In another example embodiment of the invention, a CMOS image sensor includes a metal pad positioned above a semiconductor substrate, a protection film positioned above the semiconductor substrate and above and around a first portion of the metal pad, a first planarization film positioned above the semiconductor substrate, a color filter layer positioned above the first planarization film, a second planarization layer positioned above and around the color filter layer, and a micro lens positioned above the second planarization layer. The example CMOS image sensor also includes a second portion of the metal pad that remains exposed. The micro lens includes a first material layer positioned above the second planarization layer, and a second material layer positioned above the first material layer.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF EXAMPLE EMBODIMENTS

Hereinafter, example embodiments of the invention will be described in detail with reference to the accompanying drawings.

FIGS. 2A-2H are process cross-sectional diagrams of an example method for manufacturing a CMOS image sensor.

Figure 1A:
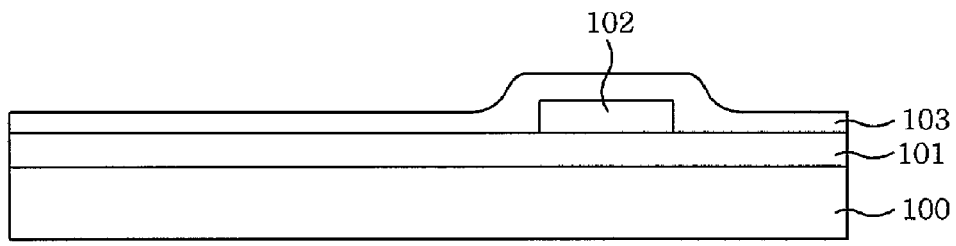
FIGS. 1A-1E are process cross-sectional diagrams of a method for manufacturing a prior art CMOS image sensor.
Figure 1B:
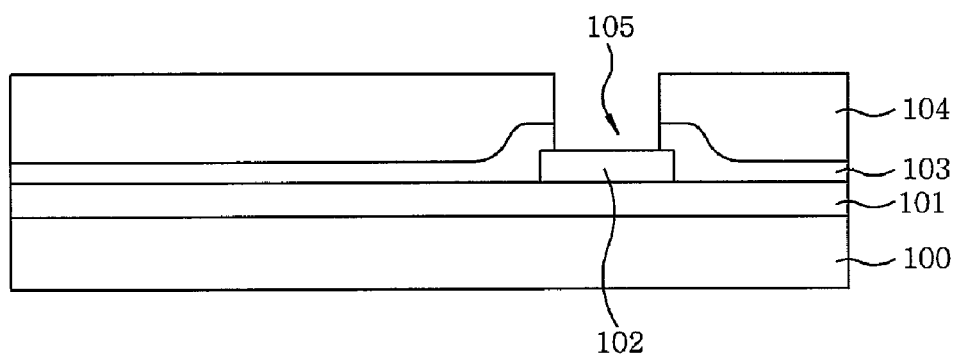
Figure 1C:
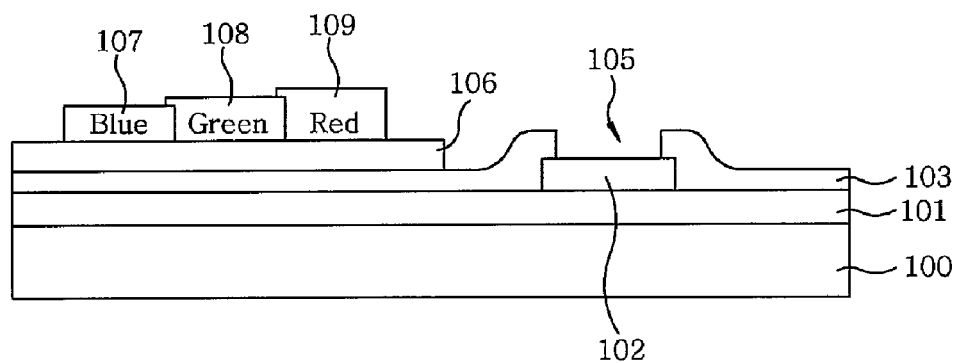
Figure 1D:
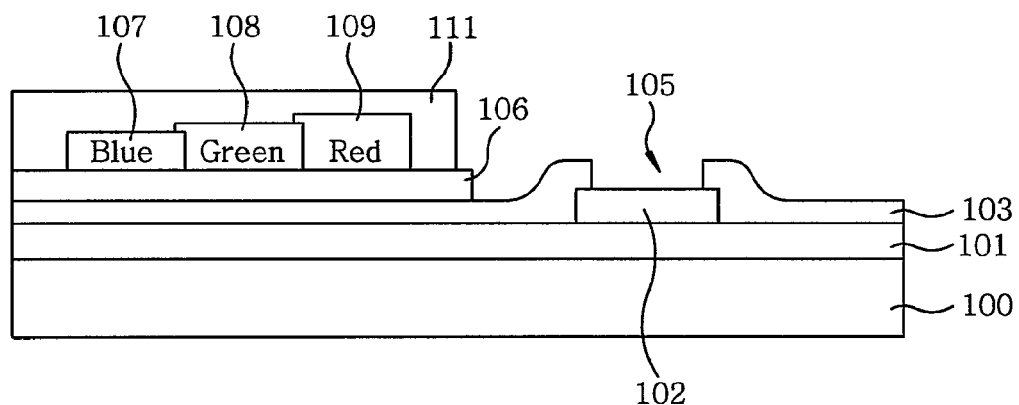
Figure 1E:
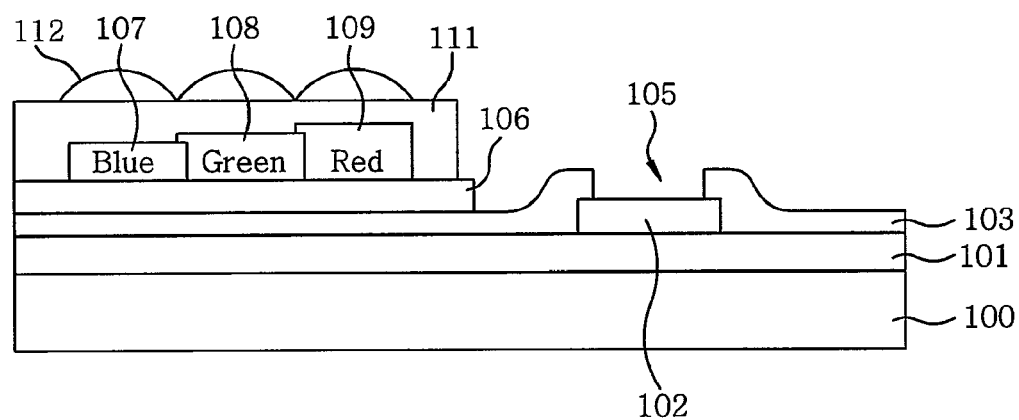
Figure 2A:
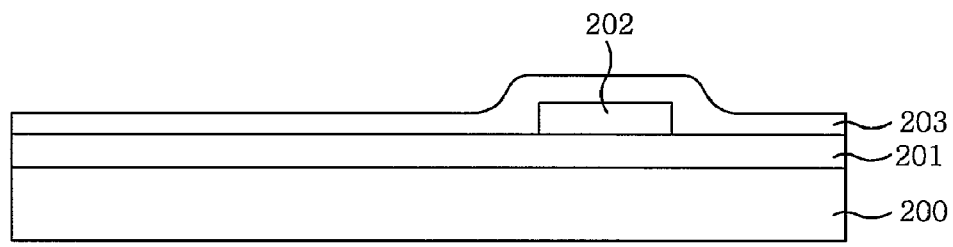
FIGS. 2A to 2H are process cross-sectional diagrams of an example method for manufacturing a CMOS image sensor.

As disclosed in FIG. 2A, an interlayer insulating film 201 is formed over a semiconductor substrate 200. Next, a metal pad 202 for each signal line is formed over the interlayer insulating film 201. The metal pad 202 can be formed of the same material on the same layer as a gate electrode. The metal pad 202 can alternatively be formed of different material via a separate contact. In one example embodiment, the metal pad 202 is formed of aluminum (Al), although other metals or metal alloys can alternatively be employed. Next, a protection film 203 is formed over the interlayer insulating film 201 and the metal pad 202. The protection film 203 can be formed of oxide or nitride, for example.

Figure 2B:
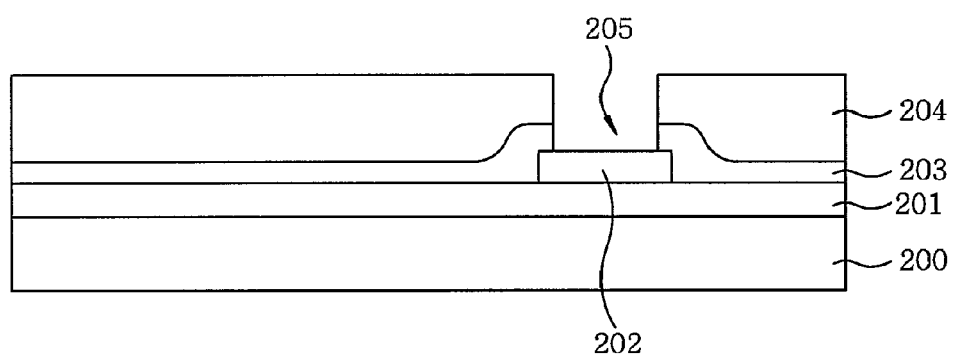

As disclosed in FIG. 2B, a photosensitive film 204 is then coated on the protection film 203. Next, the photosensitive film 204 is selectively patterned to open an upper portion of the metal pad 202 in an exposure and development process. A pad opening portion 205 is formed at the metal pad 202 by selectively etching the protection film 203 using the patterned photosensitive film 204 as a mask.

Figure 2C:
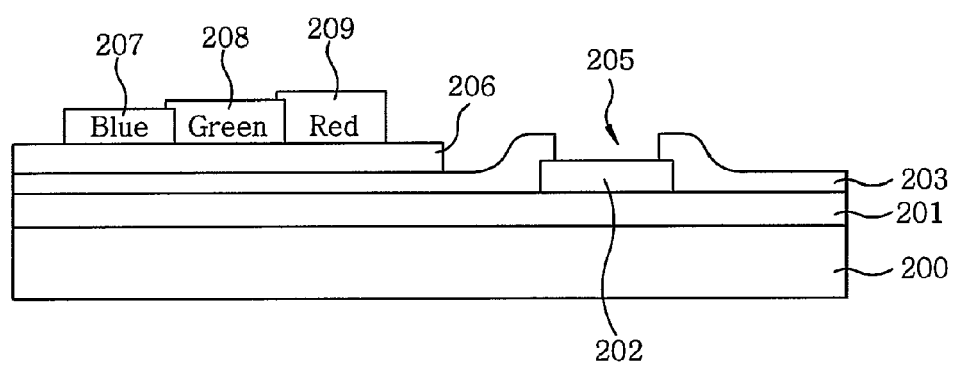

As disclosed in FIG. 2C, the photosensitive film 204 is then removed. Next, the semiconductor substrate 200 is processed by wet cleaning, thereby removing foreign materials generated at the time of forming the pad opening portion 205 and a polymer component of the photosensitive film 204. Next, a first planarization layer 206 is deposited over the protection film 203. The first planarization layer 206 is etched in a photolithography process using a mask and consequently covers the portion of the protection film 203 disclosed in FIG. 2C. A blue color filter layer 207, a green color filter layer 208, and a red color filter layer 209 are subsequently formed over the first planarization layer 206 correspondingly to respective photodiode regions (not shown). Each of the color filter layers can be formed by coating a corresponding photosensitive material in a photolithography process using a separate mask.

Figure 2D:
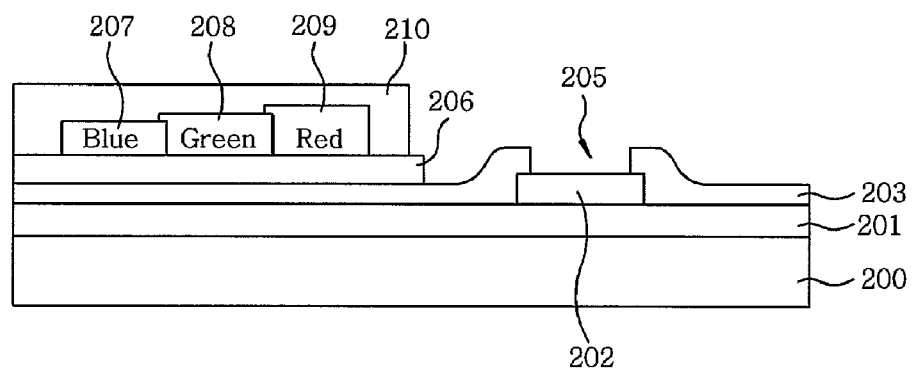

As disclosed in FIG. 2D, a second planarization layer 210 is formed over a portion of the first planarization layer 206 and the respective color filter layers 207, 208, and 209. The second planarization layer 210 is etched in a photolithography process using a mask and consequently covers the portion of the protection film 203 disclosed in FIG. 2C.

Figure 2E:
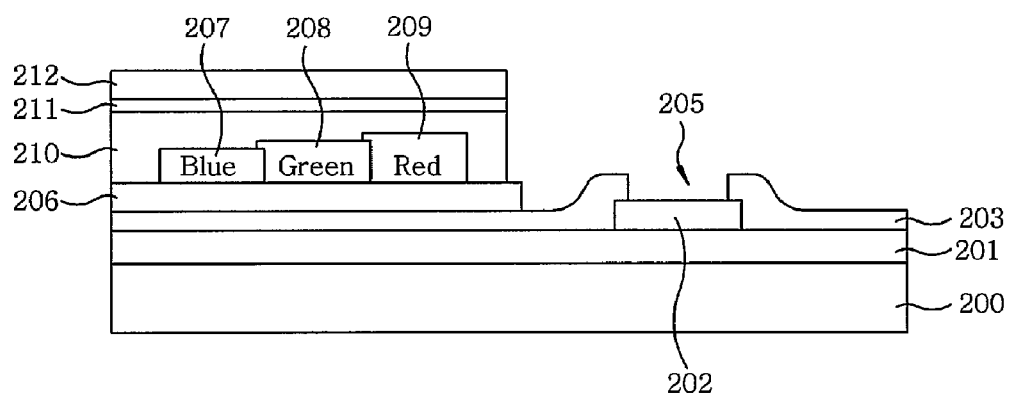

As disclosed in FIG. 2E, a Deep UltraViolet (DUV) photoresist material layer 211 having a good resolution is next coated at a thickness between about 0.1 μm and about 1.0 μm on the second planarization layer 210. A micro lens material layer 212, also known as a Middle UltraViolet (MUV) photoresist material layer 212, is then deposited over the DUV photoresist material layer 211.

Figure 2F:
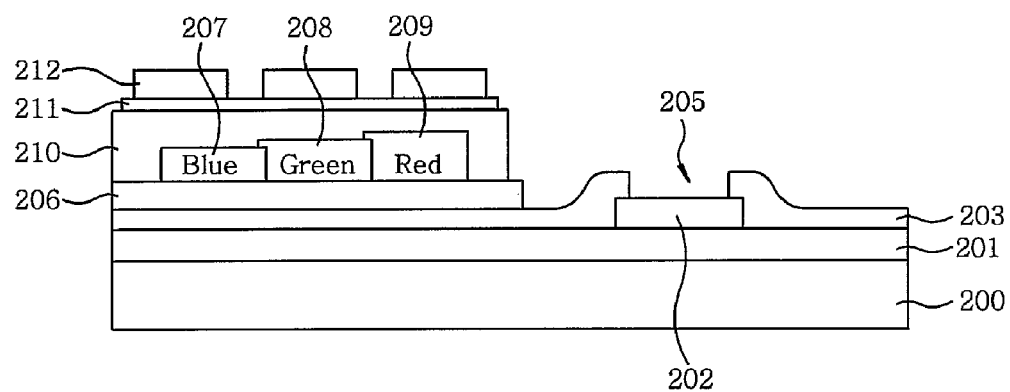
Figure 2G:
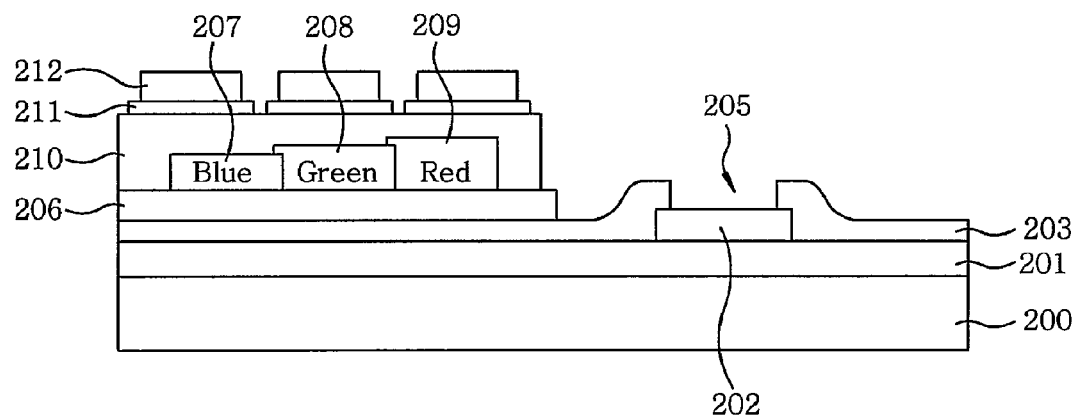

As disclosed in FIG. 2F, the overlying MUV photoresist material layer 212 is next patterned by exposure and development in a photolithography process using a mask. As disclosed in FIG. 2G, the underlying DUV photoresist material layer 211 is then patterned by exposure and development in a photolithography process using the same mask. Next, a bleach process is performed to decompose a photoactive compound and improve light transmittance of a positive photoresist. In one example embodiment, a CD of an MUV photoresist is greater than a CD of a DUV photoresist using energy for exposure by a single sheet of a DUV mask.

In one example embodiment, the DUV photoresist material layer 211 and the micro lens material layer 212 need not be sequentially developed. Instead, the micro lens material layer 212 and the DUV photoresist material layer 211 can be consecutively exposed and then simultaneously developed.

Figure 2H:
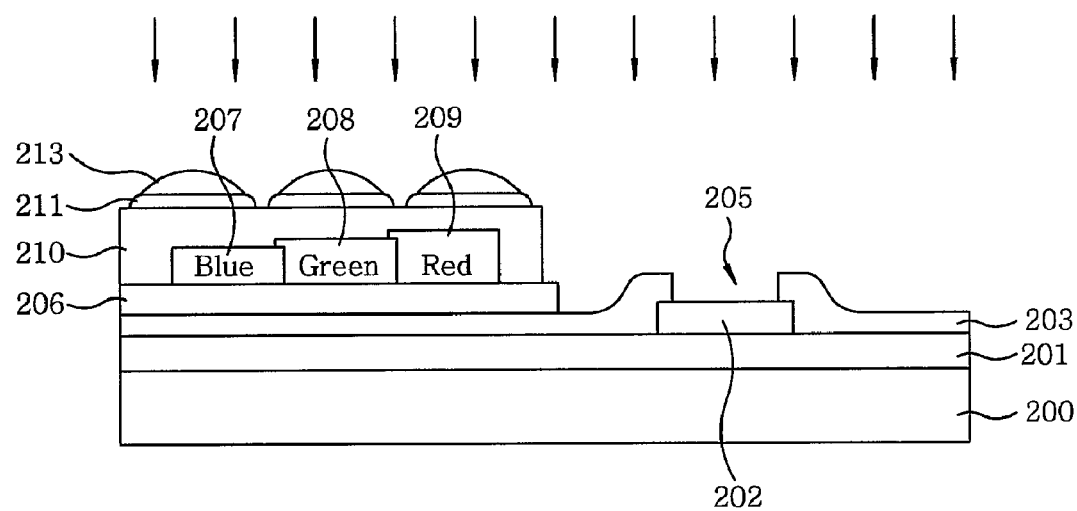

As disclosed in FIG. 2H, thermal energy is next applied to the DUV photoresist material layer 211 and the micro lens material layer 212 at a temperature between about 150° C. and about 300° C. and a reflow process is performed. As a result, hemispherical shaped micro lenses 213 having predetermined curvatures are formed. Each of the hemispherical shaped micro lenses 213 corresponds to one of the respective color filter layers 207, 208, or 209. Next, foreign materials remaining on a surface of the metal pad 202 at the time of forming the micro lenses 213 are removed by performing an oxygen plasma treatment over a whole surface of the semiconductor substrate 200. The oxygen plasma treatment remove remainders using plasma having oxygen between about 1 sccm and about 26 sccm, a buffer argon (Ar) gas between about 105 sccm and about 195 sccm, a pressure between about 70 mT and about 130 mT, and a power between about 105 W and about 195 W.

As disclosed herein, the example method for manufacturing a CMOS image sensor of FIGS. 2A-2H produces a CMOS image sensor with micro lenses 213 that include a portion of the DUV photoresist material layer 211 with a good resolution. These micro lenses 213 overcome a resolution limit of the micro lens material layer 212 and a linearity of a CD, thereby uniformly providing a gap of about 50 nm or less between each of the micro lenses 213, resulting in a relatively improved non-uniformity of photo reactivity.

While example embodiments of the invention have been disclosed herein, various changes and modifications may be made without departing from the scope of the invention as defined in the following claims.

What is claimed is:

1. A method for manufacturing a Complementary Metal Oxide Semiconductor (CMOS) image sensor, the method comprising:
   forming a metal pad over a semiconductor substrate;
   forming a protection film over the semiconductor substrate and the metal pad;
   selectively removing the protection film to expose a surface of the metal pad;
   forming a first planarization film over the protection film;
   forming a color filter layer over the first planarization film;
   forming a second planarization layer over the color filter layer;
   forming a first material layer over the second planarization layer;
   forming a second material layer over the first material layer; and
   forming a micro lens out of the first and second material layers,
       wherein the first material layer comprises a Deep UltraViolet (DUV) photoresist material layer, and
       the second material layer comprises a Middle UltraViolet (MUV) photoresist material layer.

2. The method of claim 1, wherein the first and second material layers are simultaneously developed.

3. The method of claim 1, wherein forming a metal pad over a semiconductor substrate comprises forming an aluminum metal pad over a semiconductor substrate.

4. The method of claim 1, wherein forming a protection film over the semiconductor substrate and the metal pad comprises forming an oxide protection film over the semiconductor substrate and the metal pad.

5. The method of claim 1, wherein forming a protection film over the semiconductor substrate and the metal pad comprises forming a nitride protection film over the semiconductor substrate and the metal pad.

6. The method of claim 1, wherein forming a first material layer over the second planarization layer comprises forming a first material layer having a thickness between about 0.1 μm to about 1.0 μm over the second planarization layer.

7. The method of claim 1, further comprising performing an oxygen plasma treatment over a whole surface of the semiconductor substrate 200 using plasma having oxygen between about 1 sccm and about 26 sccm, a buffer argon (Ar) gas between about 105 sccm and about 195 sccm, a pressure between about 70 mT and about 130 mT, and a power between about 105 W and about 195 W.

8. The method of claim 1, wherein forming a micro lens out of the first and second material layers further comprises forming first, second and third micro lenses out of the first and second material layers such that a gap between the first and second micro lenses is about 50 nm or less and a gap between the second and third micro lenses is about 50 nm or less.

9. A method for manufacturing a Complementary Metal Oxide Semiconductor (CMOS) image sensor, the method comprising:
   forming a metal pad over a semiconductor substrate;
   forming a protection film over the semiconductor substrate and the metal pad;
   selectively removing the protection film to expose a surface of the metal pad;
   forming a first planarization film over the protection film;
   forming a color filter layer over the first planarization film;
   forming a second planarization layer over the color filter layer;
   forming a first material layer over the second planarization layer;
   forming a second material layer over the first material layer; and
   forming a micro lens out of the first and second material layers,
       wherein the first material layer comprises a Deep UltraViolet (DUV) photoresist material layer and the second material layer comprises a Middle UltraViolet (MUV) photoresist material layer, and
       wherein a Critical Dimension (CD) of the MUV photoresist material layer is greater than a CD of the DUV photoresist material layer.

10. A method for manufacturing a Complementary Metal Oxide Semiconductor (CMOS) image sensor, the method comprising:
    forming a metal pad over a semiconductor substrate;
    forming a protection film over the semiconductor substrate and the metal pad; selectively removing the protection film to expose a surface of the metal pad;
    forming a first planarization film over the protection film;
    forming a color filter layer over the first planarization film;
    forming a second planarization layer over the color filter layer;
    forming a first material layer over the second planarization layer;
    forming a second material layer over the first material layer; and
    forming a micro lens out of the first and second material layers,
        wherein forming a micro lens out of the first and second material layers comprises:
        patterning the second material layer by exposure and development in a photolithography process using a mask;
        patterning the first material layer by exposure and development in a photolithography process using the same mask;
        performing a bleach process on the first material layer; and
        forming a substantially hemispherical shaped micro lens out of the first and second material layers by applying a thermal energy to the first and second material layers at a temperature between about 150° C. to about 300° C.

* * * * *